United States Patent
Yu et al.

(10) Patent No.: US 6,342,438 B2
(45) Date of Patent: *Jan. 29, 2002

(54) METHOD OF MANUFACTURING A DUAL DOPED CMOS GATE

(75) Inventors: Bin Yu, Fremont; Ming-Ren Lin, Cupertino, both of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/187,379

(22) Filed: Nov. 6, 1998

(51) Int. Cl.$^7$ .................................... H01L 21/265
(52) U.S. Cl. ................. 438/520; 438/528; 438/546
(58) Field of Search .................. 438/231, 233, 438/587, 621, 627, 283, 162, 407, 520, 528, 546; 257/377

(56) References Cited

U.S. PATENT DOCUMENTS

| | | | | |
|---|---|---|---|---|
| 4,700,454 A | * | 10/1987 | Baerg et al. ................ 438/297 |
| 5,162,884 A | | 11/1992 | Liou et al. .................. 257/384 |
| 5,278,085 A | * | 1/1994 | Maddox, III et al. ....... 438/587 |
| 5,330,879 A | | 7/1994 | Dennison .................... 430/313 |
| 5,382,532 A | * | 1/1995 | Kobayashi et al. ......... 438/587 |
| 5,516,707 A | * | 5/1996 | Loh et al. ................... 428/305 |
| 5,550,079 A | * | 8/1996 | Lin ............................. 438/233 |
| 5,795,800 A | * | 8/1998 | Chan et al. ................. 438/139 |
| 5,866,445 A | * | 2/1999 | Baumann .................... 438/199 |
| 5,930,642 A | * | 7/1999 | Moore et al. ............... 438/407 |
| 5,933,721 A | * | 8/1999 | Hause et al. ................ 438/217 |
| 5,936,287 A | * | 8/1999 | Gardner et al. ............. 257/369 |
| RE36,305 E | | 9/1999 | Dennison .................... 430/313 |
| 5,955,767 A | * | 9/1999 | Liu et al. .................... 257/369 |
| 5,976,952 A | * | 11/1999 | Gardner et al. ............. 438/440 |
| 5,998,272 A | | 12/1999 | Ishida et al. ................ 438/305 |
| 6,010,952 A | * | 1/2000 | Tsai et al. ................... 438/528 |
| 6,017,808 A | * | 1/2000 | Wang et al. ................. 438/528 |
| 6,096,614 A | * | 8/2000 | Wu ............................. 438/303 |
| 6,221,724 B1 | * | 4/2001 | Yu et al. ..................... 438/289 |
| 6,258,693 B1 | * | 7/2001 | Choi ........................... 438/423 |

OTHER PUBLICATIONS

T. Kuroi et al., Novel NICE(Nitrogen Implantation into CMOS Gate Electrode and Source–Drain)Structure for High Reliability and Hipp. gh Performance 0.25um Dual Gate CMOS, IEDM, pp. 325–328, Dec. 1993.*

* cited by examiner

*Primary Examiner*—Long Pham
*Assistant Examiner*—William David Coleman
(74) *Attorney, Agent, or Firm*—Foley & Lardner

(57) ABSTRACT

A dual doped CMOS gate structure utilizes a nitrogen implant to suppress dopant inter-diffusion. The nitrogen implant is provided above standard trench isolation structures. Alternatively, an oxygen implant can be utilized. The use of the implant allows an increase in packing density for ultra-large-scale integrated (ULSI) circuits. The doping for N-channel and P-channel active regions can be completed when the polysilicon gate structures are doped.

20 Claims, 4 Drawing Sheets

METHOD OF MANUFACTURING A DUAL DOPED CMOS GATE

FIELD OF THE INVENTION

The present invention relates to a complementary metal-oxide semiconductor (CMOS) fabrication process. More particularly, the present invention relates to a CMOS fabrication process using dual-doped gate structures.

BACKGROUND OF THE INVENTION

Ultra-large-scale integrated (ULSI) circuits often include more than one million CMOS transistors. The transistors can have gate lengths of less than 0.25 microns (e.g., deep submicrometer devices). The transistors typically have polysilicon gate conductors disposed between drains and sources. The polysilicon gate conductors are heavily doped for increased conductivity.

The polysilicon gate conductors can be dual-doped gate structures where the gate structures are heavily doped with N-type dopants (N+) for N-channel metal-oxide semiconductor field effect transistors (MOSFETS) and are heavily doped with P-type dopants (P+) for P-channel MOSFETS. Utilizing a dual-doped gate structure allows the active regions associated with the N-channel and P-channel MOSFETS and the polysilicon gate structures associated with the MOSFETS to be advantageously doped during the same process steps.

Dual-doped gate structures are susceptible to mutual diffusion. For example, the dopant in an N-type portion of the gate can diffuse into the adjacent P-type portion of the gate. Alternatively, the dopant in the P-type gate can diffuse into an adjacent N-type portion of the gate. Dopant mutual diffusion causes dopant compensation in regions where the N-type portion of the gate meets or neighbors a P-type portion of the gate. Dopant compensation causes several negative effects including severe gate depletion, reduction of effective channel width, and an increase of gate sheet resistance. Severe gate depletion, which occurs near the interface of the polysilicon and gate dielectric, degrades the transistor drive current and hence reduces circuit speed. Similarly, reduction of the effective gate width causes degradation of transistor drive current and hence reduction of circuit speed. Increased gate sheet resistance also degrades the speed of the transistor.

In conventional processes, mutual diffusion of the dopants in the dual-doped gate structures is suppressed by spacing N-active and P-active regions and N-well and P-well regions sufficiently far apart. However, such a solution can significantly reduce the packing density of integrated circuits and hence, the number of transistors which can be provided on an integrated circuit (IC).

Thus, there is a need for a dual-doped gate structure which is not susceptible to mutual diffusion and which does not require large spacings between N and P regions. Further still, there is a need for a process for making such a structure. Even further still, there is a need for a dual-doped gate structure which can be efficiently produced in a compacted structure.

SUMMARY OF THE INVENTION

The present invention relates to a method of manufacturing an integrated circuit including a plurality of first transistors and a plurality of second transistors. The first transistors have first gates doped with first type dopants. The second transistors have second gates doped with second type dopants. The method includes selectively implanting inert ions into a polysilicon layer at locations, selectively doping the polysilicon layer with the first type dopants for the first gates, and selectively doping the polysilicon layer with the second type dopants for the second gates. The locations are between the first gates and the second gates. The inert ions suppress dopant diffusion.

The present invention still further relates to a method of manufacturing an integrated circuit having an isolation region between a P+ gate conductor region and an N+ gate conductor region. The method includes providing a first photoresist layer over a substrate having a gate conductor layer, exposing the substrate to inert ions to provide the inert ions to the isolation region, providing a second photoresist layer exclusive of the P+ gate conductor region, exposing the substrate to P dopants to provide the P dopants to the P+ conductor region, providing a third photoresist layer exclusive of the N gate conductor region, and exposing the substrate to N dopants to provide the N dopants to the N+ conductor region.

The present invention still further relates to a method of manufacturing an ultra-large-scale integrated circuit having P-channel field effect transistors with heavily doped P-type polysilicon gates and N-channel field effect transistors having heavily doped N-type polysilicon gates. The method includes providing a polysilicon gate layer and implanting inert ions in the polysilicon gate layer at locations between the N-channel field effect transistors and the P-channel field effect transistors.

BRIEF DESCRIPTION OF THE DRAWINGS

The present invention will hereafter be described with reference to the accompanying drawings, wherein like numerals denote like elements and.

DETAILED DESCRIPTION OF THE PREFERRED EMBODIMENTS

Figure 1:
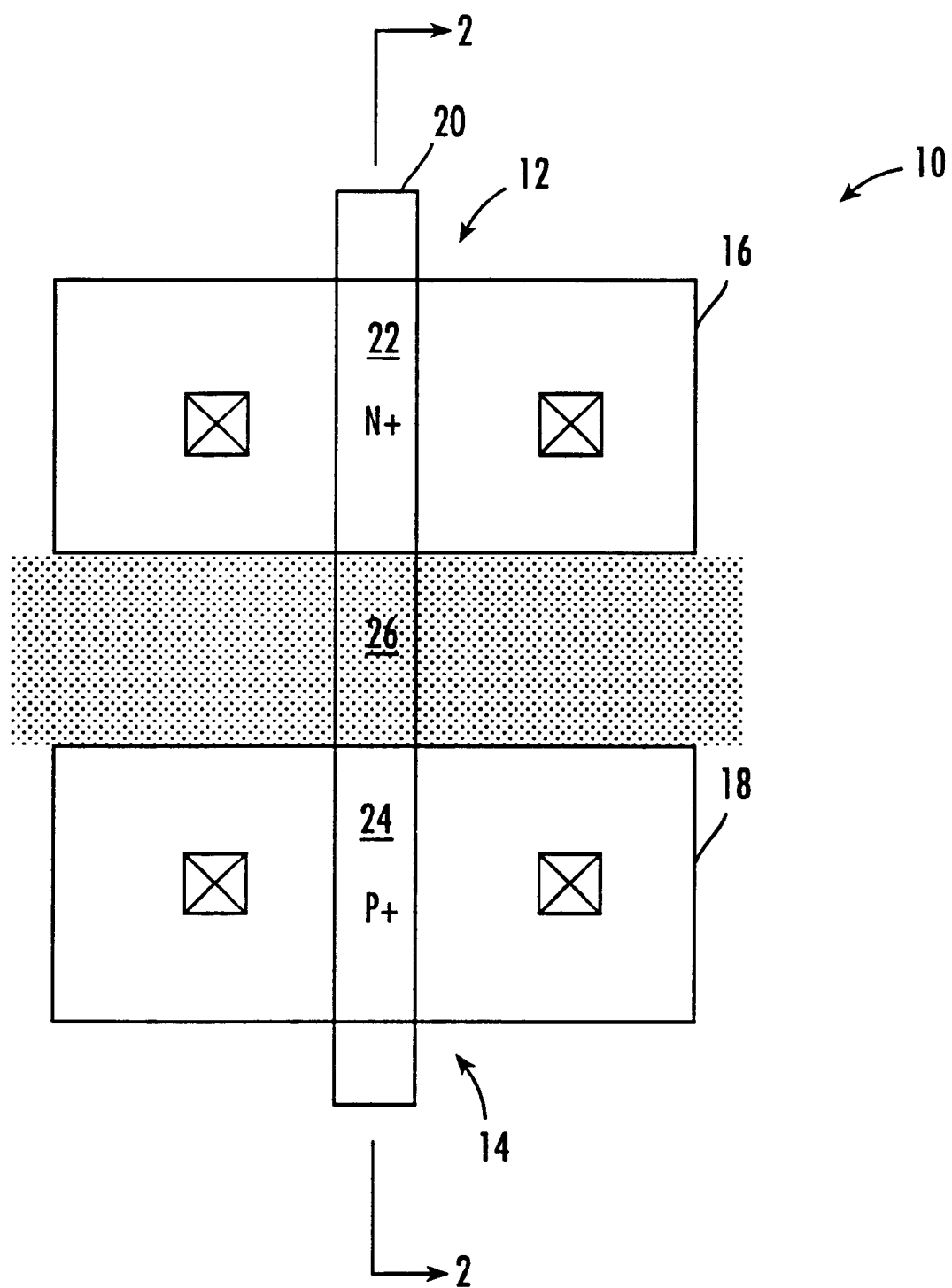
FIG. 1 is a top view of a portion of semiconductor substrate having a dual-doped gate structure in accordance with a exemplary embodiment of the present invention.
Figure 2:
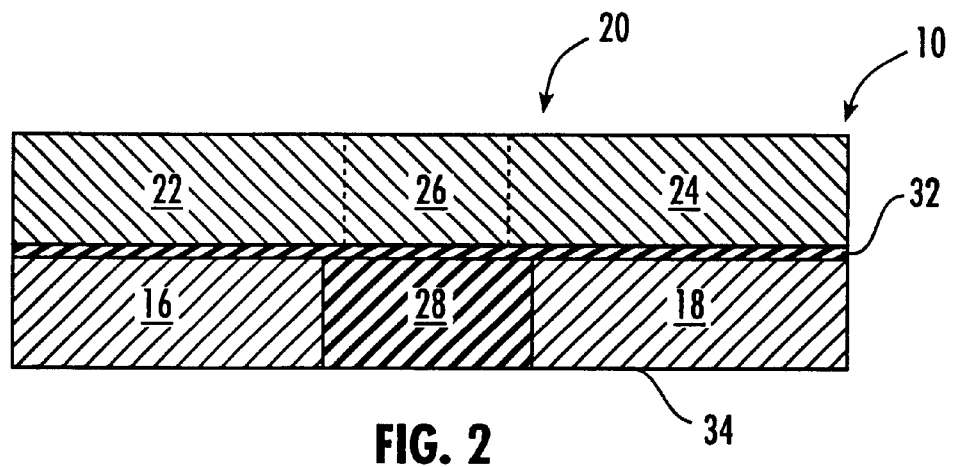
FIG. 2 is a cross sectional view of the portion of the integrated circuit illustrated in FIG. 1 about line 2—2.

With reference to FIGS. 1 and 2, a portion 10 of an integrated circuit (IC) or chip includes a transistor 12 and a transistor 14. Portion 10 is preferably provided as part of an ultra-large-scale integrated (ULSI) circuit including at least one million transistors. Portion 10 is part of an IC manufactured as part of a semiconductor wafer.

Transistor 12 is preferably an N-channel metal oxide semiconductor field effect transistor (N-MOSFET), and transistor 14 is preferably a P-channel metal oxide semiconductor field effect transistor (P-MOSFET). Transistor 12 includes an active area 16 which is heavily doped with n-type dopants (N+ region), and transistor 14 includes an active area 18 which is heavily doped with p-type dopants (P+ region). Transistors 12 and 14 share a gate conductor line 20.

Gate conductor line 20 has an N+ doped region 22 associated with transistor 12 and a P+ doped region 24 associated with transistor 14. Regions 22 and 24 are separated by an inert ion implantation region 26. Gate conductor line 20 is part of the gate structure associated with transistor 12 and the gate structure associated with transistor 14.

Active regions 16 and 18 are preferably separated by a trench isolation structure 28 (FIG. 2). Gate conductor line 20 is provided on top of a gate dielectric layer 32 provided over active regions 16 and 18 associated with a semiconductor substrate 34. Gate conductor line 20 is preferably a polysilicon material. Region 26 is part of line 20 which is doped or implanted with inert ions such as nitrogen or oxygen. The polysilicon film or material associated with line 20 is implanted with a sufficiently high dose (e.g., larger than $1\times10^{15}$ ion/cm$^2$) to provide a diffusion barrier for dopants in regions 22 and 24.

Region 22 is doped with N-type dopants, preferably to a concentration of greater than $1\times10^{19}$ dopants per centimeter cubed. Region 24 is doped with P-type dopants, preferably to a concentration of greater than $1\times10^{19}$ dopants per centimeter cubed. N-type dopants can be phosphorus, and P-type dopants can be boron. Alternatively, regions 16, 18, 22 and 24 can be doped with arsenic, indium or boron difluoride.

Alternatively, region 26 can be provided over a local oxidation (LOCOS) region, substrate 34, or other non-trench structure. Since region 26 operates as a diffusion barrier, the spacing between region 22 and 24 can be decreased, thereby increasing the packing density of portion 10 and the IC. Preferably, region 26 is doped to have a peak level of inert ions in the middle (from a vertical perspective) of gate conductor line 20. The inert ions can be oxygen, nitrogen, xenon, or other material which has a sufficiently high activation energy so that it will not become activated during subsequent heating steps.

Figure 3:
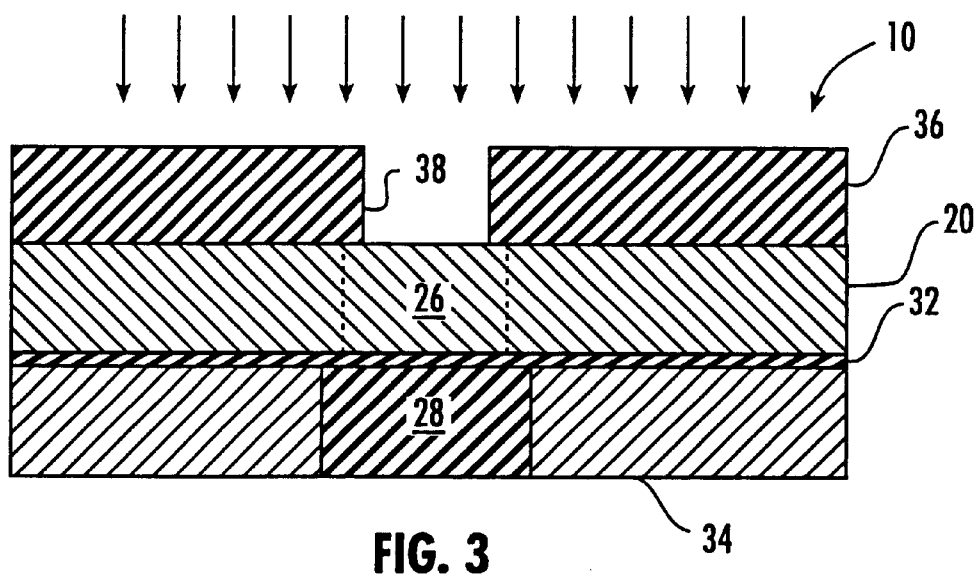
FIG. 3 is a cross-sectional view of the portion illustrated in FIG. 1 about line 2—2 showing an ion implantation step.

With reference to FIGS. 2–6, the fabrication of portion 10 is described below. In FIG. 3, substrate 34 is preferably silicon and includes a trench isolation structure 28. Structure 28 can be provided by etching and deposition of silicon dioxide. A gate dielectric layer 32 is thermally grown over substrate 34. A polysilicon layer 24, (gate conductor line 20 in FIG. 2), is provided over layer 32. Polysilicon layer 24 is preferably deposited by chemical vapor deposition (CVD) or physical vapor deposition (PVD) to a thickness of between 150 and 200 nanometers (nm).

A photoresist layer 36 is selectively applied via a photolithographic process onto layer 24. Photoresist layer 36 may be patterned in accordance with an inverse active region mask or layer 36 may be patterned in accordance with a trench isolation mask. Alternatively, the same mask may be utilized for the photoresist layer 36 and other layers depending upon the type of photoresist utilized. Therefore, additional masks are not necessary to implant ions into region 26. Photoresist layer 36 includes an aperture 38 approximately 1.5 features wide or 0.2 to 0.3 nm wide. Portion 10 is exposed to inert ions via an ion implantation process. Nitrogen, oxygen or other inert ions can be implanted into region 26 through aperture 38. Region 26 is defined by ion implantation in aperture 38. Inert ions are implanted before layer 24 is etched in the preferred embodiment, but the ions may be provided after layer 24 is etched (not shown).

Generally ion implantation of region 26 involves providing a material, preferably inert ions, e.g., nitrogen, oxygen or xenon, into gate conductor line 20. Inert ions are charged up to 10–100 kiloelectron volts (keVs) and implanted into conductor 20 at region 26. The ions can be any type of material that has a sufficiently high activation energy so the material will not become activated during subsequent thermal annealing, i.e., the step that activates other doped regions, e.g., source and drain regions in active regions 16 and 18. The ions may be implanted by any type of implantation device used in conventional implanting processes, e.g., Varin E220, Varin E1000, or Vista 80, manufactured by the Varin Corp., Palo Alto, Calif. or the AMT-9500 device manufactured by Applied Materials, Inc, the Genius 1520 manufactured by Genius Corp. Additional benefits of the present invention can be obtained by implanting nitrogen ions as opposed to oxygen ions because implantation of oxygen ions can encourage undesirable oxygen-enhanced diffusion in gate conductor line 20. Heavier inert ions can be utilized when a deeper implantation is desired.

Figure 4:
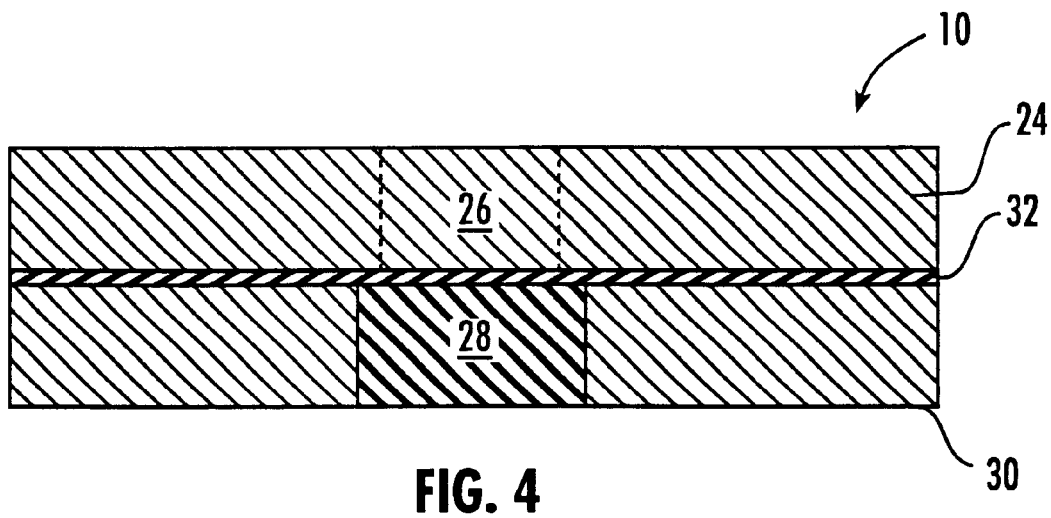
FIG. 4 is a cross-sectional view of the portion illustrated in FIG. 1 about line 2—2, showing a photoresist removal step.

With reference to FIG. 4, photoresist layer 36 is removed, and portion 10 is subjected to rapid thermal annealing which allows layer 24 and region 26 to recover from defects associated with the ion implantation process. Rapid thermal annealing involves heating substrate 34 in a chamber. A pulsed heating process can be utilized.

Figure 5:
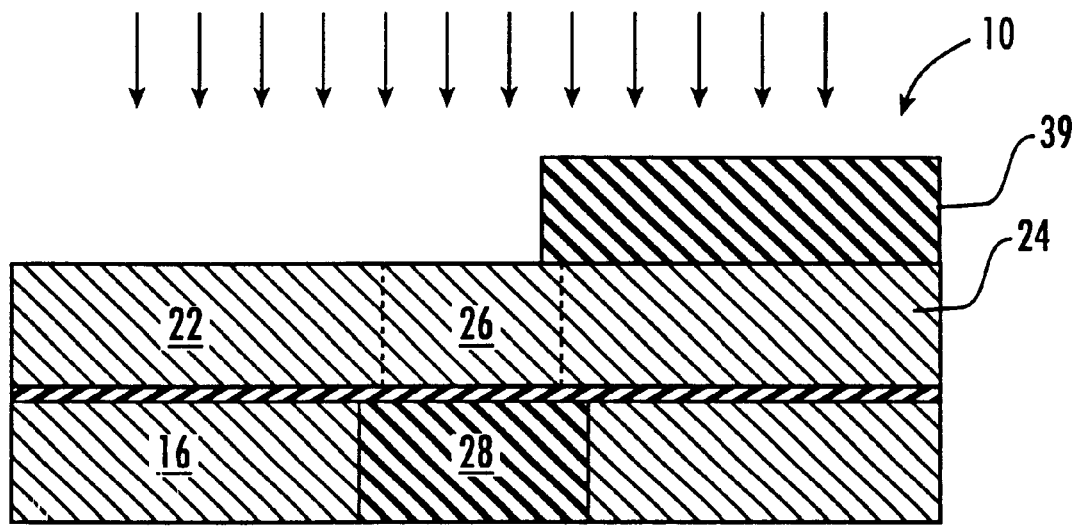
FIG. 5 is a cross-sectional view about line 2—2 of the portion illustrated in FIG. 1, showing a N-type dopant implant step.

With reference to FIG. 5, a photoresist layer 39 is provided partially over region 26 and exclusive of regions 16 and 22. Portion 10 is subjected to a N-type dopant process during which regions 16 and 22 are heavily doped (e.g., more than $1\times10^{19}$ dopants per centimeter cubed) with phosphorous or other N-type dopant. Layer 39 prevents dopants from entering the location of regions 18 and 24.

Figure 6:
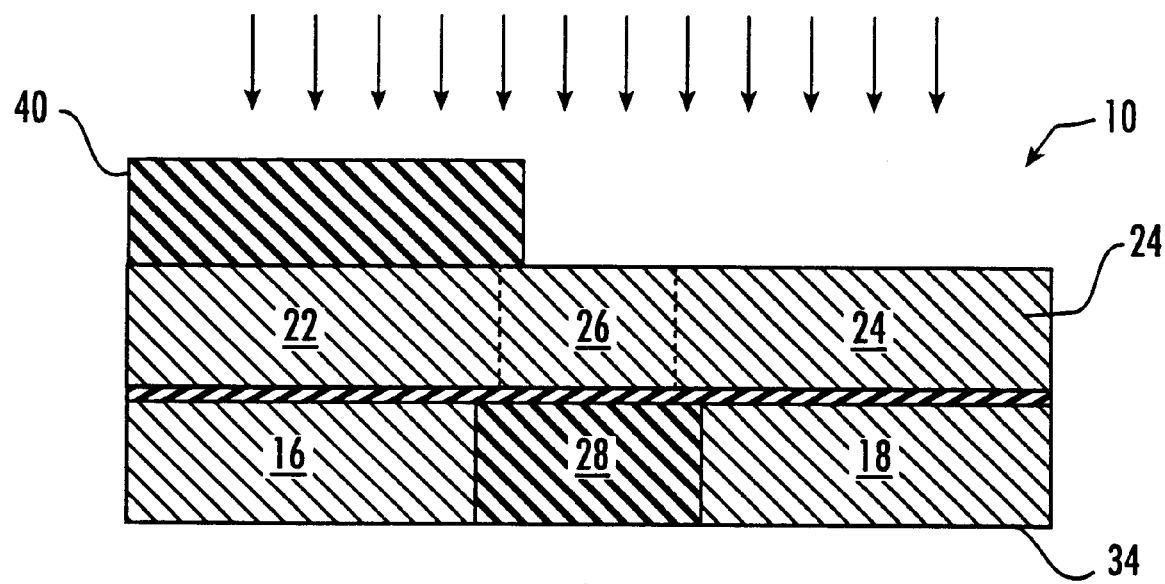
FIG. 6 is a cross-sectional view of the portion illustrated in FIG. 1 about line 2—2, showing a P-type dopant implant step.

In FIG. 6, photoresist layer 40 is provided over regions 16 and 22 and partially over region 26 in a photolithographic process. After layer 40 is provided, portion 10 is subjected to a P-type dopant implant or doping process during which regions 18 and 24 are heavily doped with boron or other P-type dopant. With reference to FIG. 2, layer 40 is stripped to provide portion 10.

Region 26 can be implanted immediately after the gate patterning process and before the gate doping process. The rapid thermal annealing step can be performed immediately after the ion implant so that the thermal budget associated with shallow source and drain junction doping is not exceeded. Sources and drains associated with transistors 12 and 14 can be provided with the doping step discussed with reference to FIGS. 5 and 6. It should be noted that portion 10 is shown throughout FIGS. 1–6 in a form which is simplified (without interconnections, source and drain regions, etc.,) to more clearly describe the present invention.

It is understood that while the detailed drawings, specific examples, and particular values are given to provide a preferred exemplary embodiment of the present invention, the preferred exemplary embodiment is for the purpose of illustration only. The method and apparatus of the invention is not limited to the precise details and conditions disclosed. For example, although particular polysilicon gate structures and MOS transistors are described, other types of gate structures can be utilized. Various changes may be made to the details disclosed without departing from the spirit of the invention which is defined by the following claims.

What is claimed is:

1. A method of manufacturing an integrated circuit including a plurality of first transistors and a plurality of second transistors, the first transistors having first gates doped with first type dopants, the second transistors having second gates doped with second type dopants, the method comprising:

selectively implanting inert ions into a polysilicon layer at locations;

selectively doping the polysilicon layer with the first type dopants for the first gates; and selectively doping the polysilicon layer with the second type dopants for the second gates, wherein the locations are between the first gates and the second gates, whereby the inert ions suppress dopant diffusion, wherein inert ions include nitrogen, oxygen or xenon ions, wherein the selectively implanting step utilizes an inverse mask of the mask used to form active regions for the first transistors and the second transistors, or wherein the selectively implanting step utilizes a mask, wherein the mask is the same mask used to form trench isolation regions for the first transistors and the second transistors.

2. The method of claim 1, wherein the inert ions are oxygen ions.

3. The method of claim 1, wherein the inert ions include xenon ions.

4. The method of claim 1, wherein the first transistors are N-channel field effect transistors and the second transistors are P-channel field effect transistors.

5. The method of claim 4, wherein the first type dopants are N-type dopants and the second type dopants are P-type dopants.

6. The method of claim 5, wherein the selectively doping steps are performed to heavily dope the polysilicon layer.

7. The method of claim 1, wherein the selectively implanting step utilizes an inverse mask of the mask used to form active regions for the first transistors and the second transistors.

8. The method of claim 1, wherein the selectively implanting step utilizes a mask, wherein the mask is the same mask used to form trench isolation regions for the first transistors and the second transistors.

9. A method of manufacturing an integrated circuit having an isolation region between a P+ gate conductor region and an N+ gate conductor region, the method comprising:

providing a first photoresist layer over a substrate having a gate conductor layer, the first photoresist layer being etched according to an isolation region mask or an inverse active region mask to be exclusive of the isolation region;

exposing the gate conductor layer to inert ions to provide the inert ions to the isolation region, wherein the inert ions include oxygen or xenon;

providing a second photoresist layer being exclusive of the P+ gate conductor region;

exposing the gate conductor layer to P dopants to provide the P dopants to the P+ conductor region;

providing a third photoresist layer exclusive of the N+ gate conductor region; and exposing the gate conductor layer to N dopants to provide the N dopants to the N+ conductor region.

10. The method of claim 9, wherein the gate conductor layer is a polysilicon layer.

11. The method of claim 9, wherein the first photoresist layer is patterned in accordance with an inverse active region mask.

12. The method of claim 9, wherein the first photoresist layer is patterned in accordance with a trench isolation mask.

13. The method of claim 9, wherein the second photoresist layer and the third photoresist layer are at least partially exclusive of the isolation region.

14. The method of claim 9, wherein the inert ions include nitrogen ions.

15. A method of manufacturing an ultra-large scale integrated circuit having P-channel field effect transistors with heavily doped P-type polysilicon gates and N-channel field effect transistors having heavily doped N-type polysilicon gates, the method comprising:

providing a polysilicon gate layer; and implanting inert ions in the polysilicon gate layer at locations between the N-channel field effect transistors and the P-channel field effect transistors, wherein the inert ions include oxygen, nitrogen, or xenon, wherein the inert ions are xenon.

16. The method of claim 15, wherein the inert ions include xenon.

17. The method of claim 16, wherein the inert ions are oxygen.

18. The method of claim 15, wherein the locations are above trench isolation regions.

19. The method of claim 15, wherein the inert ions are xenon.

20. The method of claim 15, wherein the inert ions are provided after the polysilicon gate layer is etched.

* * * * *

UNITED STATES PATENT AND TRADEMARK OFFICE
CERTIFICATE OF CORRECTION

PATENT NO. : 6,342,438 B1
DATED : January 29, 2002
INVENTOR(S) : Bin Yu and Ming-Ren Lin Page 1 of 1

It is certified that error appears in the above-identified patent and that said Letters Patent is hereby corrected as shown below:

<u>Column 6,</u>
Line 7, after "P +" insert -- gate --.
Line 11, after "N+" insert -- gate --.
Line 15, delete "an" and insert therefor -- the --.
Line 18, delete "a" and insert therefor -- the --.
Line 27, delete "having" and insert therefor -- with --.

Signed and Sealed this

Twenty-eighth Day of May, 2002

Attest:

*Attesting Officer*

JAMES E. ROGAN
*Director of the United States Patent and Trademark Office*